(12) United States Patent
Too et al.

(10) Patent No.: US 6,776,893 B1
(45) Date of Patent: Aug. 17, 2004

(54) ELECTROPLATING CHEMISTRY FOR THE CU FILLING OF SUBMICRON FEATURES OF VLSI/ULSI INTERCONNECT

(75) Inventors: Elena H. Too, Branford, CT (US); Paul R. Gerst, Madison, CT (US); Vincent Paneccasio, Jr., Madison, CT (US); Richard W. Hurtubise, Clinton, CT (US)

(73) Assignee: Enthone Inc., West Haven, CT (US)

( * ) Notice: Subject to any disclaimer, the term of this patent is extended or adjusted under 35 U.S.C. 154(b) by 0 days.

(21) Appl. No.: 09/716,975

(22) Filed: Nov. 20, 2000

(51) Int. Cl.⁷ .............. C25D 5/02; C25D 11/32; C25D 3/38; C23C 18/54
(52) U.S. Cl. ............ 205/123; 205/118; 205/157; 205/296; 205/298; 106/1.26
(58) Field of Search .................. 205/296, 298, 205/118, 123, 157; 106/1.26

(56) References Cited

U.S. PATENT DOCUMENTS

| | | | |
|---|---|---|---|
| 3,956,079 A | 5/1976 | Kardos et al. | |
| 4,038,161 A | 7/1977 | Eckles et al. | 204/52 R |
| 4,336,114 A * | 6/1982 | Mayer et al. | 204/52 R |
| 4,347,108 A | 8/1982 | Willis | 204/52 R |
| 4,376,685 A * | 3/1983 | Watson | 204/52 R |
| 4,430,173 A | 2/1984 | Boudot et al. | 204/52 R |
| 4,445,980 A | 5/1984 | Smith | 204/15 |
| 4,469,564 A | 9/1984 | Okinaka et al. | 204/15 |
| 4,551,212 A | 11/1985 | Rao et al. | 204/52 R |
| 4,555,315 A | 11/1985 | Barbieri et al. | 204/52 R |
| 4,786,746 A | 11/1988 | Miljkovic | 560/302 |
| 4,948,474 A | 8/1990 | Miljkovic | 204/52.1 |
| 4,954,226 A | 9/1990 | Mahmoud | 204/15 |
| 4,969,979 A | 11/1990 | Appelt et al. | 204/15 |
| 5,004,525 A | 4/1991 | Bernards et al. | 204/52.1 |
| 5,024,736 A * | 6/1991 | Clauss et al. | 205/275 |
| 5,051,154 A | 9/1991 | Bernards et al. | 205/24 |
| 5,151,170 A | 9/1992 | Montgomery et al. | 205/298 |
| 5,174,886 A | 12/1992 | King et al. | 205/125 |
| 5,209,817 A | 5/1993 | Ahmad et al. | 156/643 |
| 5,232,575 A | 8/1993 | Dodd | 205/238 |
| 5,252,196 A | 10/1993 | Sonnenberg et al. | 205/296 |
| 5,262,041 A | 11/1993 | Gulla | 205/125 |
| 5,298,687 A | 3/1994 | Rapoport et al. | 174/261 |
| 5,328,589 A | 7/1994 | Martin | 205/296 |
| 5,391,421 A | 2/1995 | Gulla | 428/209 |
| 5,454,930 A | 10/1995 | Miura et al. | 205/159 |
| 5,730,854 A | 3/1998 | Martin | 205/296 |
| 5,750,018 A | 5/1998 | Brasch | 205/295 |
| 5,897,375 A | 4/1999 | Watts et al. | 438/693 |
| 5,908,450 A | 6/1999 | Gross et al. | 204/242 |
| 5,913,147 A | 6/1999 | Dubin et al. | 438/687 |
| 5,935,402 A | 8/1999 | Fanti | 205/101 |
| 5,968,333 A | 10/1999 | Nogami et al. | 205/184 |
| 5,972,192 A | 10/1999 | Dubin et al. | 205/101 |
| 5,989,623 A | 11/1999 | Chen et al. | 427/97 |
| 6,017,967 A | 1/2000 | Matijevic et al. | 516/96 |
| 6,020,640 A | 2/2000 | Efland et al. | 257/751 |
| 6,024,856 A | 2/2000 | Haydu et al. | 205/84 |
| 6,024,857 A | 2/2000 | Reid | 205/123 |
| 6,025,275 A | 2/2000 | Efland et al. | 438/722 |
| 6,074,544 A | 6/2000 | Reid et al. | |
| 6,129,830 A * | 10/2000 | Senge et al. | 205/104 |
| 6,444,110 B2 * | 9/2002 | Barstad et al. | 205/123 |
| 6,518,182 B1 * | 2/2003 | Ishikawa et al. | 438/678 |

FOREIGN PATENT DOCUMENTS

| | | |
|---|---|---|
| DE | 26 10 705 A1 * | 9/1977 |
| EP | 0 068 807 A2 | 1/1983 |
| EP | 0 163 131 A2 | 12/1985 |
| EP | 0 402 896 A2 | 12/1990 |
| EP | 0 785 297 B1 | 7/1997 |
| JP | 05230687 A | 9/1993 |
| JP | 07062587 A | 3/1995 |
| JP | 07316875 A | 12/1995 |

OTHER PUBLICATIONS

Abstract only.*
Technical Data Sheet, Sel–Rex, CuBath SC, Jun. 23, 1998.

* cited by examiner

Primary Examiner—Edna Wong
(74) Attorney, Agent, or Firm—Senniger, Powers, Leavitt & Roedel

(57) ABSTRACT

A copper electroplating bath and a method to plate substrates with the bath are provided. The bath and method are particularly effective to plate electronic components such as semiconductive wafer VLSI and ULSI interconnects with void-free fill copper plating for circuitry forming vias and trenches and other small features less than 0.2 microns with high aspect ratios. The copper bath contains a bath soluble organic divalent sulfur compound, and a bath soluble polyether compound such as a block copolymer of polyoxyethylene and polyoxypropylene, a polyoxyethylene or polyoxypropylene derivative of a polyhydric alcohol and a mixed polyoxyethylene and polyoxypropylene derivative of a polyhydric alcohol. A preferred polyether compound is a mixed polyoxyethylene and polyoxypropylene derivative of glycerine. A preferred copper bath also contains a pyridine compound derivative.

40 Claims, No Drawings

ELECTROPLATING CHEMISTRY FOR THE CU FILLING OF SUBMICRON FEATURES OF VLSI/ULSI INTERCONNECT

BACKGROUND OF THE INVENTION

1. Field of the Invention

This invention relates to the making of electronic components such as semiconductor wafer VLSI and ULSI interconnects, and, more particularly, to a copper electroplating bath and method to plate the vias and trenches and other small features of the components to provide void-free fill for features below about 0.2 microns and with high aspect ratios.

2. Description of Related Art

The demand for manufacturing semiconductor integrated circuit (IC) devices such as computer chips with high circuit speed, high packing density and low power dissipation requires the downward scaling of feature sizes in ultra-large-scale integration (ULSI) and very-large-scale integration (VLSI) structures. The trend to smaller chip sizes and increased circuit density requires the miniaturization of interconnect features which severely penalizes the overall performance of the structure because of increasing interconnect resistance and reliability concerns such as fabrication of the interconnects and electromigration.

In general, such structures use silicon wafers with silicon dioxide ($SiO_2$) being the dielectric material and openings are formed in the $SiO_2$ dielectric layer in the shape of vias and trenches which are then metallized forming the interconnects. Increased miniaturization is reducing the openings to submicron sizes (e.g., 0.2 micron and lower) and increasing the aspect ratio (ratio of the height of the opening to the width of the opening) of the features.

Copper is becoming the metal of choice to form the interconnects and copper can be deposited on substrates by plating (such as electroless and electrolytic), sputtering, plasma vapor deposition (PVD) and chemical vapor deposition (CVD). It is generally recognized that a plating-based deposition is the best method to apply copper to the device since it can provide high deposition rates and low tool costs. However, plating methods must meet the stringent requirements of the semiconductor industry. For example, the copper deposits must be uniform and capable of filling the extremely small trenches and vias of the device. The deposition of copper from acid copper baths is recognized in the electronics industry as the leading candidate to copper plate integrated circuit devices. It will be appreciated by those skilled in the art however that other metal baths such as Ni, Au, Ag, Zn, Pd, Sn, etc. may be used with the additive system of the present invention to provide improved metal plating baths and that this description is directed to copper for convenience.

Copper electroplating, in general, involves deposition of a copper layer onto a surface by means of electrolysis using a consumable copper electrode or an insoluble anode. In the consumable electrolytic plating process, the copper electrode is consumed during the plating operation and must be replaced periodically during the plating operation. When plating using insoluble anodes, these anodes are not consumed in the plating process and do not have to be replaced.

A preferred plating apparatus and method is described in U.S. Pat. No. 6,024,856 assigned to the same assignee as the present application.

It has been found that conventional copper electroplating baths are only marginally effective when the plating surface contains very small features (i.e., submicron) and/or with high aspect ratios. In particular, the copper fill in a small feature tends to have voids and these voids may increase the resistance or even cause an open circuit of the conductive path intended to be formed by the copper deposited in the feature. This problem becomes critical in using copper electrodeposition processes in integrated circuit fabrication because contact and via holes in an integrated circuit can be 0.2 micron or less in width, with an aspect ratio of up to four-to-one or greater and voids in the contacts and vias may easily result causing high resistance interconnects or even open-circuits.

As the copper interconnect technologies have advanced to more complex geometries, so have the demands for better copper electroplating baths to fill the vias and trenches on wafers that are getting smaller in feature size and higher in aspect ratios. Consequently, the conventional acid copper electrochemical deposition systems can no longer meet the higher performance level needed to fill void-free feature sizes below about 0.20 micron. The prior art has attempted to improve the acid copper bath chemistry but there is still a need for improved acid copper baths for the plating of high performance semiconductor wafers and other such electronic components.

Bearing in mind the problems and deficiencies of the prior art, it is therefore an object of the present invention to provide a copper electroplating bath which provides void-free fill features particularly below about 0.20 microns, when plating electronic components such as semiconductor wafers having trenches and vias and other small features.

It is another object of the present invention to provide a method for copper electroplating electronic components such as semiconductor wafers particularly those having features below about 0.20 microns.

A further object of the invention is to provide semiconductor wafers plated using the method and copper electroplating bath of the invention.

Still other objects and advantages of the invention will in part be obvious and will in part be apparent from the specification.

SUMMARY OF THE INVENTION

In accordance with the above goals and objectives, in the present invention there is provided in one embodiment an improved copper electroplating bath for use in electroplating electronic components such as semiconductor wafers having submicron vias and trenches particularly those having features below about 0.20 microns. Broadly stated, in an aqueous acidic electrolyte containing copper in an amount sufficient to electrodeposit copper on a substrate, the improvement comprises incorporating in the electrolyte an additive system comprising:

a bath soluble organic divalent sulfur compound corresponding to the formula:

$$R_1-(S)_n-RXO_3M \qquad (I)$$

wherein:

M is hydrogen, alkali metal or ammonium as needed to satisfy the valence;

X is S or P;

R is an alkylene or cyclic alkylene group of 1 to 8 carbon atoms, an aromatic hydrocarbon or an aliphatic aromatic hydrocarbon of 6 to 12 carbon atoms;

n is 1 to 6, preferably 1 to 2; and $R_1$ is $MO_3XR$ wherein M, X and R are as defined above or by the formula:

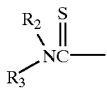

wherein:

R₂ and R₃ are hydrogen, an alkyl group of 1 to 4 carbon atoms, a heterocyclic group or an aromatic group; and a bath soluble polyether compound selected from the group consisting of block copolymers of polyoxyethylene and polyoxypropylene, a polyoxyethylene or polyoxypropylene derivative of a polyhydric alcohol and a mixed polyoxyethylene and polyoxypropylene derivative of a polyhydric alcohol.

The bath soluble polyether compound is in one embodiment a block copolymer of polyoxyethylene and polyoxypropylene glycols. More preferably, the bath soluble polyether compound is a polyoxyethylene or polyoxypropylene derivative of glycerine or other polyhydric alcohol such as sorbitol, mannitol and pentaerythritol and the like and most preferably is a mixed polyoxyethylene and polyoxypropylene derivative of a polyhydric alcohol, particularly glycerine.

In another embodiment a method is provided for plating copper onto electronic components such as semiconductor wafers having submicron vias and trenches using the copper plating bath of the invention.

In a further embodiment semiconductor wafers and other electronic components having sub-micron features made using the copper electroplating bath and method of the invention are also provided.

DESCRIPTION OF THE PREFERRED EMBODIMENT(S)

In accordance with the composition and method aspects of the present invention, the invention is generally operable in aqueous acidic copper plating baths for electroplating wherein high concentrations of acid are used with low copper ion concentrations.

Aqueous acidic copper plating baths of the present invention are typically of the acidic copper sulfate type or acidic copper fluoborate type although other acids may be used. In accordance with conventional practice, aqueous acidic copper sulfate baths typically contain about 10 to about 45 g/l of copper ions with preferred concentrations of about 15 to about 20 g/l. Acid concentrations in these baths typically range about 45 to about 260 g/l of acid and preferably in amounts of about 85 to about 200 g/l acid. Fluoborate solutions and other acids typically use the same ratio of acid to metal in the bath. The additives used in the electroplating baths of the present invention are particularly advantageous in such low copper ion/high acid solution baths to provide the enhanced plating results.

Other acids which are useful because of their demonstrated effectiveness are methanesulfonic acid; 1-hydroxyethylidene-1,1-diphosphonic acid; 2-phosphonobutane-1,2,4-tricarboxylic acid; and trifluoromethane sulfonic acid. Other suitable acids may also be used.

An essential component of the copper bath of the present invention comprises organic divalent sulfur compounds including sulfonated or phosphonated organic sulfides, i.e., organic compounds carrying at least one sulfonic or phosphonic group.

The preferred organic sulfonates or phosphonates can be represented by the formula:

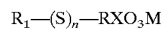

wherein M is hydrogen, an alkali metal or ammonium ion needed to satisfy the valence; X is S or P; n is 1 to 6 preferably 1 to 2; R is an alkylene or cyclic alkylene group of 1 to 8 carbon atoms, an aromatic hydrocarbon or an aliphatic aromatic hydrocarbon of 6 to 12 carbon atoms; R₁ is a group represented by the formula MO₃XR, wherein M, X and R are as defined above or by the formula:

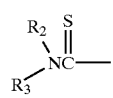

wherein R₂ and R₃ are hydrogen, an alkyl group of 1 to 4 carbon atoms, a heterocyclic group or an aromatic group.

A preferred compound because of its demonstrated effectiveness is 1-propanesulfonic acid, 3,3'-dithiobis, disodium salt as shown in Formula (I) wherein M is sodium, X is S, R is (CH₂)₃, n is 2 and R₁ is MO₃XR. This compound is represented by the formula:

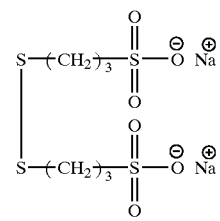

Another preferred compound because of its demonstrated effectiveness is 1-propanesulfonic acid, 3[(dimethylamino)-thioxomethyl]-thio-, sodium salt as shown in Formula (I) wherein n=1, R₁ is formula (II), R₂ and R₃ are both CH₃, R is (CH₂)₃, X is S and M is sodium. This compound is represented by the formula:

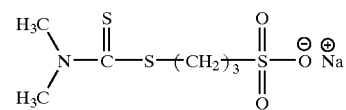

The alkylene portion of the molecule may be substituted with groups such as methyl, ethyl, chloro, bromo, ethoxy, hydroxy, carboxy and the like.

The above organic sulfide compounds are present in the plating baths of the present invention in amounts within the range of about 0.5 to 1000 mg per liter, or more preferably, about 5 to about 50 mg/l and most preferably about 5 to 30 mg/l.

Other sulfonate compounds may be used but have not been found to be as effective as the preferred compounds of Formula I. Exemplary, referring to Formula I, are:

A. 1-propanesulfonic acid, 3-mercapto-, monosodium salt

MPS

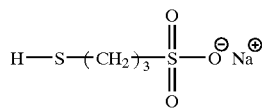

wherein $R_1$ is H, n is 1, R is $(CH_2)_3$, X is S and M is sodium;

B. 1-propanesulfonic acid, 3-(-benzothiazolylthio)-, sodium salt

ZPS

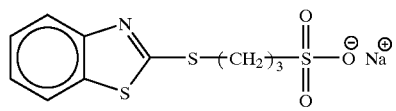

wherein $R_1$ is benzothiozolyl, n is 1, R is $(CH_2)_3$, X is S and M is sodium;

C. 1-propanesulfonic acid, 3-[(ethoxythioxomethyl)-thio-]-potassium salt

OPX

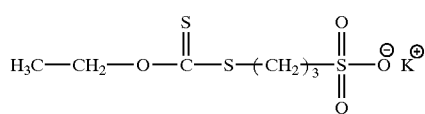

wherein $R_1$ is

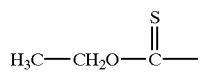

n is 1, R is $(CH_2)_3$, X is S and M is potassium; and

D. 1-propanesulfonic acid, 3-[(aminoiminomethyl)-thio]-sodium salt

UPS

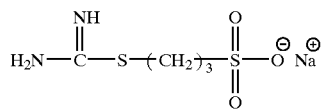

wherein $R_1$ is

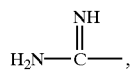

n is 1, R is $(CH_2)_3$, X i s and M is Na.

The above compounds A–D are shown as K or Na salts, but may be any alkali metal or ammonium.

An essential component of the bath is a bath soluble polyether compound. It is important that the polyether compound have a cloud point higher than the operating temperature of the bath. Most preferably, the compound is also low foaming.

One class of polyether component contains mixed alkoxy groups such as block copolymers of polyethylene oxide and polypropylene oxide and may be represented by the formula:

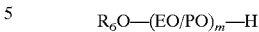

and

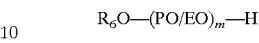

where $R_6$ is hydrogen or an aliphatic or aromatic hydrocarbon group having 1 to 40 carbon atoms, EO/PO are alkoxy moieties, preferably selected from mixed ethoxy (EO)/ propoxy (PO) groups although may also include butoxy, m is an integer of at least 1, typically up to 100 or more, and preferably up to about 50.

This class of polyether is typically made by first polymerizing either the EO or PO moieties, preferably the PO moiety, to form a block chain of the moiety. This block chain is then polymerized with the other moiety to cap the block on both ends of the block chain. The polymer chain may be represented schematically by EO-PO-EO or PO-EO-PO. The EO-PO-EO block polymer may be shown structurally as:

VA

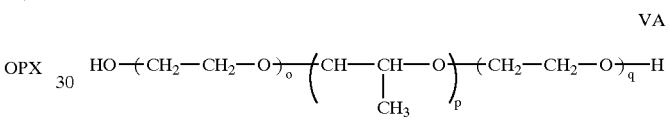

wherein o and q are each about 1 to 25 and p is about 10 to 70.

The preferred polyether block copolymer containing ethylene oxide and propylene oxide blocks has a molecular weight of about 1100 to 10,000, preferably 1100 to 6000 and most preferably 1100–3500 and is sold commercially under the name PLURONIC. These materials are also referred to herein as L31, L35, L44, L64, and P123 with the higher numbers representing higher molecular weights.

Another polyether suitable compound is an alkoxy derivative of a polyhydric alcohol such as glycerol, sorbitol and mannitol and may be represented schematically by the formula:

VI

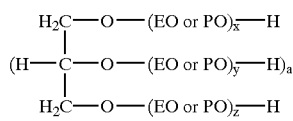

wherein x+y+z is about 3 to 100 or more, preferably about 5 to 30 and most preferably about 5 to 20, e.g., 10 and a is an integer of 1 to 4.

Exemplary glycerine derivatives are shown as follows:

VIA

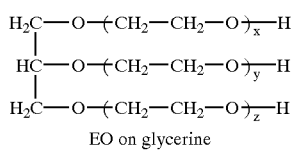

EO on glycerine

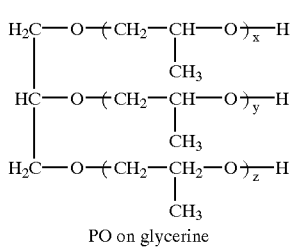

PO on glycerine

A preferred PO on glycerin compound is termed GL100 and has a molecular weight of about 700 and x+y+x is about 10.

Another preferred polyether compound is a mixed alkoxy derivative of formula VI as follows:

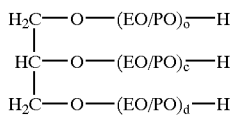

VII wherein b+c+d is about 3 to 150 or more, preferably 10 to 100 and most preferably 30 to 75.

A highly preferred polyether compound is a derivative of glycerine wherein a of formula VI is 1 and may be represented by the formula:

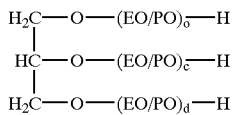

VIIA

Exemplary glycerine derivatives are as follows:

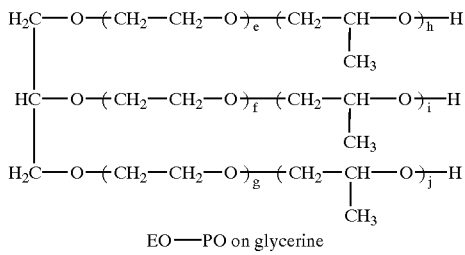

EO—PO on glycerine

VIIB

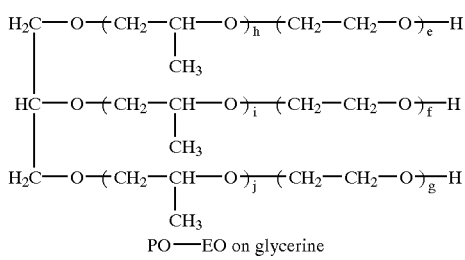

PO—EO on glycerine

VIIC wherein e+f+g and h+i+j are each about 5 to 100 or more, preferably 10 to 50 and most preferably 20 to 40. Compound VIIB is particularly preferred because of its demonstrated effectiveness.

The preferred polyhydric alcohol derivative because of its demonstrated effectiveness is shown in VIIB and has the EO block attached to a polyhydric (glycerine) backbone followed by a PO block. This preferred compound has an average molecular weight of about 2500 wherein e+f+g is about 21 and h+i+j is about 27. This derivative is also referred to herein as GH200 or T-COL 206.

With regard to the mixed alkoxy polyhydric compounds above it will be appreciated by those skilled in the art that the compounds are generally made by forming a first alkoxy chain on the polyhydric backbone then followed by the second alkoxy chain so that the EO block will be attached to the polyhydric backbone followed by the PO block or vice versa wherein the PO block is attached to the polyhydric backbone followed by the EO block.

The polyethers are generally utilized in an amount of about 0.02 to about 2 g/l, typically 0.04 to about 1.5 g/l and preferably 0.1 to 1 g/l.

For further enhanced via and trench and other feature copper filling properties, another component which is preferred to be used in the bath of the invention may be represented by the general formula:

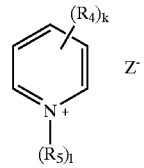

III wherein Z is a counterion from $SO_3$ as for $R_5$ or any compatible anion to satisfy electrical neutrality;

$R_4$ is hydrogen, an alkyl substituent having 1 to 3 carbon atoms, an aromatic, sulfonic group, phosphonic group, aldehyde group or a carbamide group;

$R_5$ is a group having the following formula:

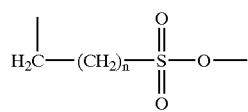

IV wherein n is an integer of 1 to 3, k is 0 or 1, l is 0 or 1, and at least one of k or l is 1, and the sulfonate group may be a phosphonate group.

Exemplary compounds because of their demonstrated effectiveness are:

A. 3-Formyl-1-(3-sulfopropyl)-pyridinium betaine

FPPS

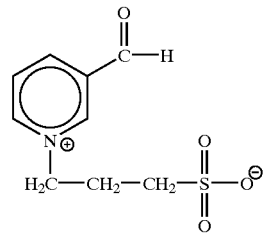

wherein $R_4$ is formyl, k is 1 and $R_5$ is formula IV wherein n is 2 and l is 1;

B. Isoquinoline 1-propanesulfonic acid

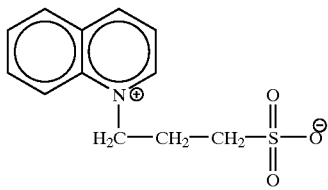

IQPS wherein $R_4$ is a benzene ring, k is 1, and $R_5$ is formula IV wherein n is 2 and l is 1;

C. 1-(3-sulfopropyl)pyridinium betaine

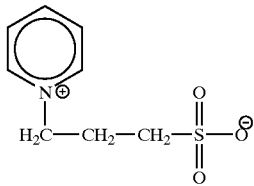

PPS wherein k is 0 and $R_5$ is formula IV wherein n is 2 and l is 1;

D. 3-Pyridinesulfonic acid

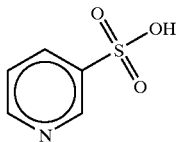

PYSA wherein $R_4$ is $SO_3H$, k is 1 and l is 0; and

E. Nicotinamide N-propylsulfonate

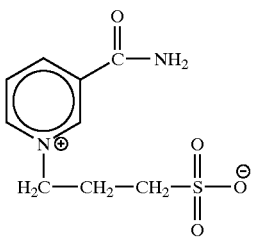

wherein $R_4$ is carbamide, k is 1 and $R_5$ is formula IV wherein n is 2 and l is 1.

These additives are generally used in the bath in an amount of 5 to 10,000 mg/l, preferably 10 to 5,000 mg/l, and most preferably 100 to 1,000 mg/l.

Also brighteners and other conventional additives such as soluble polyamines, substituted polyamines, quaternized polyamines and quaternized substituted polyamines may be utilized in the bath of the present invention, typically in quantities of from about 1 to about 10 mg/l. The baths also preferably contain chloride ions in an amount up to about 100 mg/l, typically 45 mg/l.

In accordance with the method aspects of the present invention, acidic copper plating baths of the present invention are typically operated at current densities ranging from about 5 to about 60 amperes per square foot (ASF) (0.5 to 6 ASD) although current densities as low as about 0.5 ASF to as high as about 100 ASF (0.05 to 10 ASD) can be employed under appropriate conditions. Preferably, current densities of from about 5 to about 50 ASF (0.5 to 5 ASD) are employed. In plating conditions in which high agitation is present, higher current densities ranging up to about 100 ASF (10 ASD) can be employed as necessary and for this purpose a combination of air agitation, cathode movement and/or solution pumping may be employed. The operating temperature of the plating baths may range from about 15° C. to as high as about 50° C. and above with temperatures of about 21° C. to about 36° C. being typical.

Further understanding of the present invention will be had with reference to the following examples which are set forth herein for purposes of illustration but not limitation. The operating temperature of the baths were 22 to 26° C. unless otherwise indicated.

EXAMPLE 1

Conventional 4-component Brightener Systems and the Effect of GH 200 and GL 100 Cu=17 g/l; $H_2SO_4$=185 g/l; Cl=10 mg/l; CD=1.0 ASD

| Additives | Bath 1 | Bath 2 | Bath 3 | Bath 4 |
|---|---|---|---|---|
| IA | 28 mg/l | 28 mg/l | 28 mg/l | 28 mg/l |
| Carbowax 3350[1] | 13 mg/l | 13 mg/l | 13 mg/l | 200 mg/l |
| 400XB[2] | 1.3 mg/l | 1.3 mg/l | 2.8 mg/l | 1.3 mg/l |
| Q-Pech[3] | 11 mg/l | 11 mg/l | 5 mg/l | 11 mg/l |
| GH200 | — | 15 mg/l | 15 mg/l | — |
| GL100[4] | — | 45 mg/l | 45 mg/l | — |
| Trench size filled | >0.25 μm | >0.18 μm | >0.18 μm | >0.25 μm |

[1]Polyethylene glycol
[2]PEI derivative
[3]Quaternary PE epichlorohydrin
[4]Glycerine derivative contain propyleneoxide blocks This example shows the beneficial effect of GH200 which is a mixed EO/PO glycerin derivative as shown generally in Formula VII and specifically as Formula VIIB and GL 100 which is a glycerine derivative containing only propyleneoxide blocks. IA is 1-propanesulfonic acid, 3,3'-dithiobis, disodium salt.

EXAMPLE 2

Simplified 2-component Brightener Systems Using a Primary S with GH 200 Cu=17 g/l; $H_2SO_4$=155 g/l; Cl=45 mg/l; CD=1.5 ASD

| Additives | Bath 5 | Bath 6 |
|---|---|---|
| IA | 10 mg/l | — |
| GH200 | 0.5 g/l | 0.5 g/l |
| IB | — | 10 mg/l |
| Trench size filled | 0.15–0.17 μm | 0.15–0.17 μm |

This example shows the low trench size feature fill properties using the copper electroplating bath of the invention.

Other primary sulfur additives such as MPS, UPS, OPX, ZPS used in place of additives IA and IB filled feature sizes larger than 0.17 μm.

EXAMPLE 3

Two Component Brightener Systems Using O-tug (Primary S) and a Polyol (Wetting Agent) Cu=17 g/l; $H_2SO_4$=155 g/l; Cl=45 mg/l; CD=1.5 ASD

| Additives | Bath 7 | Bath 8 | Bath 9 | Bath 10 | Bath 11 | Bath 12 | Bath 13 |
|---|---|---|---|---|---|---|---|
| IA | 10 mg/l | 10 mg/l | 10 mg/l | 10 mg/l | 10 mg/l | 10 mg/l | 10 mg/l |
| GH200 | 0.5 g/l | — | — | — | — | — | — |
| L31 | — | 0.5 g/l | — | — | — | — | — |
| L35 | — | — | 0.5 g/l | — | — | — | — |
| L44 | — | — | — | 0.5 g/l | — | — | — |
| L64 | — | — | — | — | 0.5 g/l | — | — |
| P123 | — | — | — | — | — | 0.5 g/l | — |
| T-Col 206 | — | — | — | — | — | — | 0.5 g/l |
| Trench size Filled (μm) | 0.15–0.17 | 0.15–0.17 | 0.15–0.17 | 0.15–0.17 | 0.15–0.17 | 0.15–0.17 | 0.15–0.17 |

This example shows the low trench size feature fill properties using the copper electroplating bath of the invention using Pluronics and the mixed EO/PO glycerine derivatives.

EXAMPLE 4

Three Component Brightener Systems Using a Primary Sulfur Additive, a Wetting Agent, and a Secondary Sulfur Additive Cu=17 g/l; $H_2SO_4$=140 g/l; Cl=35 mg/l; CD=1.5 ASD

| Additives | Bath 14 | Bath 15 | Bath 16 | Bath 17 | Bath 18 | Bath 19 |
|---|---|---|---|---|---|---|
| IB | 10 mg/l | 10 mg/l | 10 mg/l | 10 mg/l | 10 mg/l | — |
| T-Col 206 | 0.5 g/l | 0.5 g/l | 0.5 g/l | 0.5 g/l | 0.5 g/l | — |
| PYSA | — | 1.0 g/l | — | — | — | — |
| FPPS | — | — | 0.5 g/l | — | — | — |
| PPS | — | — | — | 1.0 g/l | — | — |
| IQPS | — | — | — | — | 0.5 g/l | — |
| IA | — | — | — | — | — | 20 mg/l |
| GH200 | — | — | — | — | — | 0.5 g/l |
| NPS | — | — | — | — | — | 20 mg/l |
| Trench size (μm) | 0.15–0.17 | 0.14–0.15 | 0.14–0.15 | 0.12–0.13 | 0.12–0.13 | 0.12–0.13 |

This example shows the beneficial effects on lowering the fill feature trench size when using the bath of the invention with a secondary sulfur compound as in Formula III.

EXAMPLE 5

Three Component Brightener Systems with Alternate Acid Cu=18 g/l; MSA=95 g/l; Cl=40 mg/l

| Additives | | 0.5 ASD | 1.5 ASD |
|---|---|---|---|
| IA | 10 mg/l | | |
| PYSA (Secondary S) | 1.0 g/l | | |
| L31 (Wetter) | 0.5 g/l | | |
| Trench size filled μm | | 0.12–0.13 | 0.14–0.15 |

This example shows the effect of current density on trench fill size.

Substituting $CuSO_4$ for the Cu-MSA system also showed trench fill capability at 0.14–0.15 μm when plated at 1.5 ASD.

Other alternate acids that may be used are 1-hydroxyethylidene-1,1-diphosphonic acid; 2-phosphonobutane-1,2,4-tricarboxylic acid; and trifluoromethanesulfonic acid.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for electrolytic copper filling interconnect features in semiconductor integrated circuit devices, the method comprising:

immersing a semiconductor integrated circuit substrate having via and trench interconnect features in an electrolytic solution containing a) copper in an amount sufficient to electrodeposit copper onto the substrate, b) a bath soluble organic divalent sulfur compound corresponding to the formula:

$$R_1 \!-\! (S)_n RXO_3 M \qquad (I)$$

wherein:

M is hydrogen, alkali metal or ammonium as needed to satisfy the valence;

X is S or P;

R is an alkylene or cyclic alkylene group of 1 to 8 carbon atoms, an aromatic hydrocarbon or an aliphatic aromatic hydrocarbon of 6 to 12 carbon atoms;

n is 1 to 6; and $R_1$ is $MO_3XR$ wherein M, X and R are as defined above, and c) a bath soluble polyether compound selected from the group consisting of block copolymers of polyoxyethylene and polyoxypropylene, a polyoxyethylene or polyoxypropylene derivative of a polyhydric alcohol and a mixed polyoxyethylene and polyoxypropylene derivative of a polyhydric alcohol; and supplying current to the electrolytic solution to fill copper into the via and trench interconnect features and thereby yield a semiconductor integrated circuit substrate with copper-filled via and trench interconnect features.

2. The method of claim 1 wherein is M is sodium, X is S, R is $(CH_2)_3$, n is 2 and $R_1$ is $MO_3XR$.

3. The method of claim 1 wherein the bath soluble polyether compound is represented by the formula:

or

where $R_6$ is hydrogen or an aliphatic or aromatic hydrocarbon group having 1 to 40 carbon atoms, EO/PO and PO/EO are mixed ethoxy (EO)/propoxy (PO) groups, m is an integer of at least 1.

4. The method of claim 3 wherein the bath soluble polyether compound has a molecular weight of about 1100–10,000.

5. The method of claim 1 wherein the bath soluble polyether compound is represented by the formula:

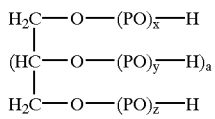 (VIB)

wherein x+y+z is about 3 to 100 and a is 1.

6. The method of claim 5 wherein x+y+z is about 10.

7. The method of claim 1 wherein the bath soluble polyether compound is represented by the formula:

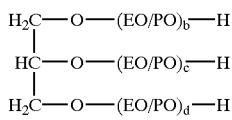 VII wherein b+c+d is about 3 to 150.

8. The method of claim 7 wherein the via and trenches have openings 0.2 micron or lower.

9. The method of claim 1 wherein the bath soluble polyether compound is represented by the formula

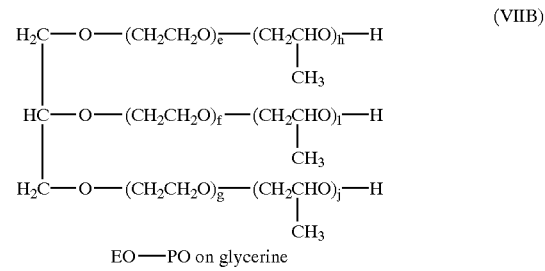

wherein e+f+g and h+i+j are each about 5 to 100.

10. The method of claim 9 wherein the compound is formula VIIB wherein e+f+g is about 21 and h+i+j is about 27.

11. The method of claim 9 wherein the via and trenches have openings 0.2 micron or lower.

12. The method of claim 1 wherein the bath soluble polyether compound is represented by the formula

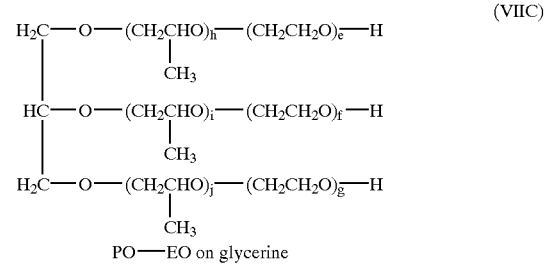

wherein e+f+g and h+i+j are each about 5 to 100.

13. The method of claim 12 wherein the via and trenches have openings 0.2 micron or lower.

14. The method of claim 1 wherein the via and trenches have openings 0.2 micron or lower.

15. A method for electrolytic copper filling interconnect features in a semiconductor integrated circuit device, the method comprising:

immersing a semiconductor integrated circuit substrate having interconnect features in an electrolytic solution containing:

a) copper in an amount sufficient to electrodeposit copper on the substrate;

b) a bath soluble organic divalent sulfur compound corresponding to the formula:

wherein:

M is hydrogen, alkali metal or ammonium as needed to satisfy the valence;

X is S or P;

R is an alkylene or cyclic alkylene group of 1 to 8 carbon atoms, an aromatic hydrocarbon or an aliphatic aromatic hydrocarbon of 6 to 12 carbon atoms;

n is 1 to 6; and $R_1$ is defined by the formula:

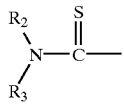 (II)

wherein:

$R_2$ and $R_3$ are hydrogen, an alkyl group of 1 to 4 carbon atoms, a heterocyclic group or an aromatic group; and c) a bath soluble polyether compound selected from the group consisting of block copolymers of polyoxyethylene and polyoxypropylene, a polyoxyethylene or polyoxypropylene derivative of a polyhydric alcohol and a mixed polyoxyethylene and polyoxypropylene derivative of a polyhydric alcohol; and supplying current to the electrolytic solution to fill copper into the interconnect features and thereby yield a semiconductor integrated circuit substrate with copper-filled interconnect features.

16. The method of claim 15 wherein M is sodium, X is S, R is $(CH_2)_3$, n is 1, and $R_1$ is

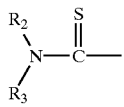

wherein $R_2$ and $R_3$ are both $CH_3$.

17. An aqueous acidic electrolyte containing:

copper in an amount sufficient to electrodeposit copper on a substrate;

a bath soluble organic divalent sulfur compound corresponding to the formula:

wherein n is 1, R is $(CH_2)_3$, X is S, M is potassium, and $R_1$ is

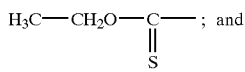 ; and a bath soluble polyether compound selected from the group consisting of block copolymers of polyoxyethylene and is polyoxypropylene, a polyoxyethylene or polyoxypropylene derivative of a polyhydric alcohol and a mixed polyoxyethylene and polyoxypropylene derivative of a polyhydric alcohol.

18. An aqueous acidic electrolyte containing:

a) copper in an amount sufficient to electrodeposit copper on a substrate;

b) a bath soluble organic divalent sulfur compound corresponding to the formula:

wherein:

M is hydrogen, alkali metal or ammonium as needed to satisfy the valence;

X is S or P;

R is an alkylene or cyclic alkylene group of 1 to 8 carbon atoms, an aromatic hydrocarbon or an aliphatic aromatic hydrocarbon of 6 to 12 carbon atoms;

n is 1 to 6; and $R_1$ is $MO_3XR$ wherein M, X and R are as defined above;

c) a bath soluble polyether compound selected from the group consisting of block copolymers of polyoxyethylene and polyoxypropylene, a polyoxyethylene or polyoxypropylene derivative of a polyhydric alcohol and a mixed polyoxyethylene and polyoxypropylene derivative of a polyhydric alcohol; and d) a compound of the formula:

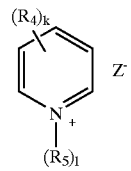

wherein:

Z is a counterion or any compatible anion to satisfy electrical neutrality;

wherein $R_4$ is formyl, k is 1 and $R_5$ is selected from the following formulas IV and IV':

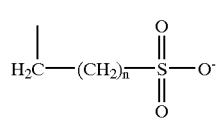 (IV)

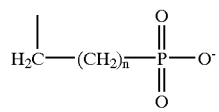 (IV')

wherein n is 2 and l is 1.

19. An aqueous acidic electrolyte containing:

a) copper in an amount sufficient to electrodelosit copper on a substrate:

b) a bath soluble organic divalent sulfur compound corresponding to the formula:

wherein:

M is hydrogen, alkali metal or ammonium as needed to satisfy the valence:

X is S or P;

R is an alkylene or cyclic alkylene group of 1 to 8 carbon atoms, an aromatic hydrocarbon or an aliphatic aromatic hydrocarbon of 6 to 12 carbon atoms;

n is 1 to 6; and $R_1$ is $MO_3XR$ wherein M, X and R are as defined above;

c) a bath soluble polyether compound selected from the group consisting of block copolymers of polyoxyethylene and polyoxypropylene a polyoxyethylene or polyoxypropylene derivative of a polyhydric alcohol and a mixed polyoxyethylene and polyoxypropylene derivative of a polyhydric alcohol;

d) a further compound of the formula:

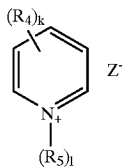

wherein:

Z is a counterion or any compatible anion to satisfy electrical neutrality;

$R_4$ is a benzene ring, k is 1;

$R_5$ is a group represented by formula IV:

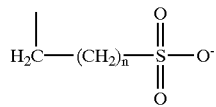

wherein n is 2 and l is 1.

20. A method for electrolytic copper filling interconnect features in semiconductor integrated circuit devices, the method comprising:

immersing a substrate for an integrated circuit device having via and trench interconnect features in an electrolytic solution containing:

copper in an amount sufficient to electrodeposit copper onto the substrate;

a bath soluble organic divalent sulfur compound;

a bath soluble polyether compound represented by the formula:

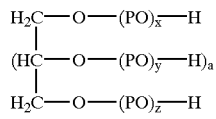

wherein x+y+z is about 3 to 100 and a is 1; and supplying current to the electrolytic solution to fill copper into the via and trench interconnect features and thereby yield an integrated circuit substrate with copper-filled via and trench interconnect features.

21. The method of claim 20 wherein x+y+z is about 10.

22. The method of claim 20 wherein the via and trenches have openings 0.2 micron or lower.

23. A method for electrolytic copper filling interconnect features in semiconductor integrated circuit devices, the method comprising:

immersing a semiconductor integrated circuit substrate having via and trench interconnect features in an electrolytic solution containing:

copper in an amount sufficient to electrodeposit copper onto the substrate;

a bath soluble organic divalent sulfur compound;

a bath soluble polyether compound represented by the formula:

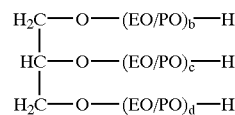

wherein b+c+d is about 3 to 150; and supplying current to the electrolytic solution to fill copper into the via and trench interconnect features and thereby yield an integrated circuit substrate with copper-filled via and trench interconnect features.

24. The method of claim 23 wherein the via and trenches have openings 0.2 micron or lower.

25. A method for electrolytic copper filling interconnect features in semiconductor integrated circuit devices, the method comprising:

immersing a semiconductor integrated circuit substrate having via and trench interconnect features in an electrolytic solution containing:

copper in an amount sufficient to electrodeposit copper onto the substrate;

a bath soluble organic divalent sulfur compound;

a bath soluble polyether compound represented by the formula:

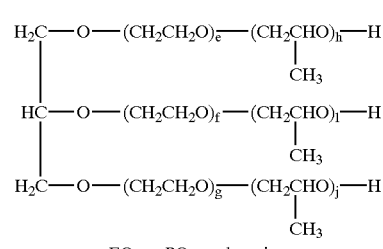

EO—PO on glycerine wherein e+f+g and h+i+j are each about 5 to 100; and supplying current to the electrolytic solution to fill copper into the via and trench interconnect features and thereby yield a semiconductor integrated circuit substrate with copper-filled via and trench interconnect features.

26. The method of claim 25 wherein the compound is formula VIIB wherein e+f+g is about 21 and h+i+j is about 27.

27. The method of claim 26 wherein the copper is copper ions and the amount of copper ions is about 10 g/L to about 45 g/L.

28. The method of claim 25 wherein the copper is copper ions and the amount of copper ions is about 10 g/L to about 45 g/L.

29. The method of claim 25 wherein the via and trenches have openings 0.2 micron or lower.

30. An aqueous acidic electrolyte bath for copper filling interconnect features in a semiconductor integrated circuit substrate, the bath containing:

copper in an amount sufficient to electrodeposit copper onto the substrate;

a bath soluble organic divalent sulfur compound;

a bath soluble polyether compound represented by the formula:

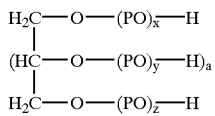
(VIB)

wherein x+y+z is about 3 to 100 and a is 1.

31. The bath of claim 30 wherein x+y+z is about 10.

32. The bath of claim 30 wherein the copper is copper ions and the amount of copper ions is about 10 g/L to about 45 g/L.

33. An aqueous acidic electrolyte bath for copper filling interconnect features in a semiconductor integrated circuit substrate, the bath containing:

copper in an amount sufficient to electrodeposit copper onto the substrate;

a bath soluble organic divalent sulfur compound;

a bath soluble polyether compound represented by the formula:

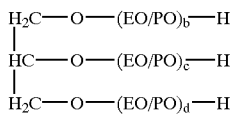

wherein b+c+d is about 3 to 150.

34. The bath of claim 33 wherein the copper is copper ions and the amount of copper ions is about 10 g/L to about 45 g/L.

35. An aqueous acidic electrolyte bath for copper filling interconnect features in a semiconductor integrated circuit substrate, the bath containing:

copper in an amount sufficient to electrodeposit copper onto the substrate;

a bath soluble organic divalent sulfur compound;

a bath soluble polyether compound represented by the formula:

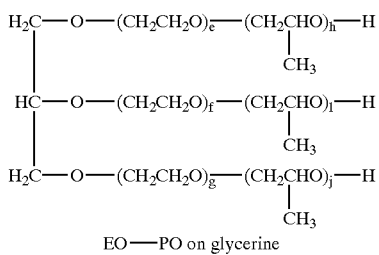
(VIIB)

wherein e+f+g and h+i+j are each about 5 to 100.

36. The bath of claim 35 wherein the compound is formula VIIB wherein e+f+g is about 21 and h+i+j is about 27.

37. The bath of claim 35 wherein the copper is copper ions and the amount of copper ions is about 10 g/L to about 45 g/L.

38. A method for electrolytic copper filling interconnect features in semiconductor integrated circuit devices, the method comprising:

immersing a semiconductor integrated circuit substrate having via and trench interconnect features in an electrolytic solution containing:

copper in an amount sufficient to electrodeposit copper onto the substrate;

a bath soluble organic divalent sulfur compound;

a bath soluble polyether compound represented by the formula:

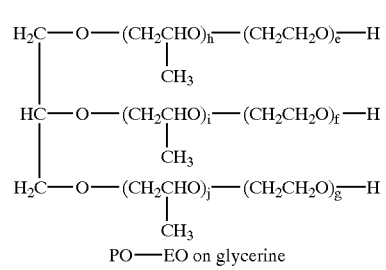
(VIIC)

wherein e+f+g and h+i+j are each about 5 to 100; and supplying current to the electrolytic solution to fill copper into the via and trench interconnect features and thereby yield a semiconductor integrated circuit substrate with copper-filled via and trench interconnect features.

39. The method of claim 38 wherein the via and trenches have openings 0.2 micron or lower.

40. An aqueous acidic electrolyte bath for copper filling interconnect features in a semiconductor integrated circuit substrate, the bath containing:

copper in an amount sufficient to electrodeposit copper onto the substrate;

a bath soluble organic divalent sulfur compound;

a bath soluble polyether compound represented by the formula:

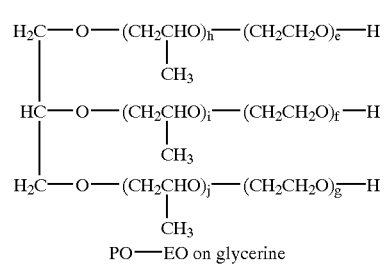
(VIIC)

wherein e+f+g and h+i+j are each about 5 to 100.

* * * * *